United States Patent
Chiang (10) Patent No.: US 9,545,027 B2
(45) Date of Patent: Jan. 10, 2017

(54) CLIP AND ELECTRONIC DEVICE USING SAME

(71) Applicant: DELTA ELECTRONICS, INC., Taoyuan Hsien (TW)

(72) Inventor: Tzu-Tsung Chiang, Taoyuan Hsien (TW)

(73) Assignee: DELTA ELECTRONICS, INC., Taoyuan Hsien (TW)

( * ) Notice: Subject to any disclaimer, the term of this patent is extended or adjusted under 35 U.S.C. 154(b) by 0 days.

(21) Appl. No.: 14/821,193

(22) Filed: Aug. 7, 2015

(65) Prior Publication Data

US 2016/0295733 A1  Oct. 6, 2016

(30) Foreign Application Priority Data

Mar. 30, 2015  (TW) .............................. 104110350 A (51) Int. Cl.
| | |
|---|---|
| H05K 7/02 | (2006.01) |
| H05K 7/04 | (2006.01) |
| H05K 7/12 | (2006.01) |
| H01R 9/26 | (2006.01) |
| H02B 1/052 | (2006.01) |
| H05K 7/14 | (2006.01) |

(52) U.S. Cl.
CPC .............. *H05K 7/12* (2013.01); *H01R 9/2691* (2013.01); *H02B 1/0523* (2013.01); *H05K 7/1474* (2013.01)

(58) Field of Classification Search
CPC .......... H05K 3/301; H05K 7/06; H05K 7/142; G06F 1/184; G06F 1/185
USPC  361/801, 803, 807, 809, 810, 648; 439/716, 625, 709, 712, 715, 188, 507, 439/513, 43, 527, 532
See application file for complete search history.

(56) References Cited

U.S. PATENT DOCUMENTS

| | | | | |
|---|---|---|---|---|
| 5,775,955 | A | * 7/1998 | Graube ................ | H01R 9/2408 439/716 |
| 5,904,592 | A | * 5/1999 | Baran ................... | H02B 1/052 361/627 |
| 6,293,820 | B1 | 9/2001 | Bechaz et al. | |
| 7,374,453 | B1 | * 5/2008 | Allcock ................ | B66C 7/08 439/532 |
| 7,516,927 | B2 | * 4/2009 | Portal .................. | H01R 9/2608 248/221.11 |

(Continued)

FOREIGN PATENT DOCUMENTS

| | | |
|---|---|---|
| EP | 1833132 A1 | 9/2007 |
| EP | 2677846 A1 | 12/2013 |

*Primary Examiner* — Hung S Bui

(74) *Attorney, Agent, or Firm* — Kirton McConkie; Evan R. Witt (57) ABSTRACT

An electronic device is detachably mounted on a DIN rail. The DIN rail includes a first protruding edge and a second protruding edge. The electronic device includes a main body and two clips. The two clips are movably disposed on the main body. Each clip includes a base and an extension part. The base includes a notch. The notch is selectively engaged with or disengaged from the first protruding edge or the second protruding edge. The extension part is connected with the base and extended from the base. The extension part includes a double-bevel bulge and an elastic extension arm. The elastic extension arm is located beside the double-bevel bulge. A free end of the elastic extension arm has an engaging part. The notches of the two clips are engaged with or disengaged from the first protruding edge and the second protruding edge, respectively.

17 Claims, 10 Drawing Sheets

(56) References Cited

U.S. PATENT DOCUMENTS

| | | | |
|---|---|---|---|
| 7,674,129 B1* | 3/2010 | Liu | H02B 1/052 |
| | | | 361/807 |
| 8,226,433 B1* | 7/2012 | Correll | H01R 9/2608 |
| | | | 439/532 |
| 2006/0079124 A1* | 4/2006 | Barile | H02B 1/052 |
| | | | 439/532 |
| 2008/0108248 A1 | 5/2008 | Lim et al. | |
| 2014/0131543 A1* | 5/2014 | Goto | G10H 1/348 |
| | | | 248/429 |

* cited by examiner

CLIP AND ELECTRONIC DEVICE USING SAME

FIELD OF THE INVENTION

The present invention relates to a clip, and more particularly to a clip for assisting in mounting an electronic device on a DIN rail. The present invention also relates to an electronic device with a clip.

BACKGROUND OF THE INVENTION

DIN rails are widely applied to various systematic apparatuses or various computer cases. For allowing an electronic device such as a programmable logic controller (PLC) to be detachably mounted on the DIN rail, the electronic device is equipped with one or more clips. Through the clips, the electronic device can be mounted on the DIN rail.

Conventionally, the electronic device comprises a fixed clip and a movable clip. The fixed clip is installed on a main body of the electronic device. The movable clip is installed on a main body of the electronic device and at the position corresponding to the fixed clip. The movable clip is movable in response to an external force. When the external force is released, the movable clip is restored to the original shape. For mounting the electronic device on the DIN rail, the fixed clip of the main body of the electronic device is firstly engaged with a first lateral side of the DIN rail, and then the main body of the electronic device is pressed into the DIN rail. In response to the pressing force, the movable clip is subjected to deformation. After the movable clip is engaged with a second lateral side of the DIN rail, the movable clip is restored to the original shape. Under this circumstance, the electronic device is fixed on the DIN rail.

As mentioned above, the conventional electronic device comprises two different types of clips (i.e., the fixed clip and the movable clip). For mounting the electronic device on the DIN rail, the main body of the electronic device has to be inclined relative to the DIN rail at an angle. After the fixed clip is engaged with the first lateral side of the DIN rail and the main body of the electronic device is pressed into the DIN rail, the movable clip is engaged with the second lateral side of the DIN rail, so that the electronic device is fixed on the DIN rail. However, the applications of the electronic device are restricted. For example, the electronic device cannot be detached from or coupled with the DIN rail along the direction perpendicular to the DIN rail.

In accordance with another approach, the electronic device comprises two movable clips. The two movable clips are separately disposed on the main body of the electronic device and located at the corresponding positions of the main body. For mounting the electronic device on the DIN rail, the two movable clips are pushed externally toward two opposite sides, and then the main body of the electronic device is pressed into the DIN rail. After the two movable clips are restored, the two movable clips are engaged with two opposite sides of the DIN rail. Under this circumstance, the electronic device is fixed on the DIN rail. As mentioned above, it is necessary to externally push the two movable clips in order to mount the electronic device on the DIN rail. In other words, the process of mounting the electronic device on the DIN rail is time-consuming and inconvenient.

In accordance with a further approach, the electronic device comprises two movable clips and a pull lever. The two movable clips are separately disposed on the main body of the electronic device and located at the corresponding positions of the main body. Through the pull lever, the two movable clips can be pushed externally toward two opposite sides, so that the electronic device can be detached from or coupled with the DIN rail. However, since the movable clips and the pull lever are different structures, the movable clips and the pull lever are produced through different molds. Moreover, the process of assembling the movable clips and the pull lever with the main body is very complicated, the assembling cost is high.

SUMMARY OF THE INVENTION

An object of the present invention provides a clip and an electronic device with the clip. The clip has simplified structure and low cost. Consequently, the electronic device can be easily mounted on or detached from the DIN rail through the clip.

In accordance with an aspect of the present invention, there is provided an electronic device. The electronic device is detachably mounted on a DIN rail. The DIN rail includes a first protruding edge and a second protruding edge. The electronic device includes a main body, a first clip and a second clip. The first clip is movably disposed on the main body, and includes a first base and a first extension part. The first base has a first notch. The first extension part is connected with the first base and extended from the first base. The first extension part includes a first double-bevel bulge and a first elastic extension arm. The first elastic extension arm is located beside the first double-bevel bulge. A free end of the first elastic extension arm has a first engaging part. The second clip is movably disposed on the main body, and includes a second base and a second extension part. The second base has a second notch. The second extension part is connected with the second base and extended from the second base. The second extension part includes a second double-bevel bulge and a second elastic extension arm. The second elastic extension arm is located beside the second double-bevel bulge. A free end of the second elastic extension arm has a second engaging part. The first elastic extension arm of the first clip is contacted with the second double-bevel bulge. The second elastic extension arm of the second clip is contacted with the first double-bevel bulge. The first elastic extension arm of the first clip is movable along the second double-bevel bulge. The second elastic extension arm of the second clip is movable along the first double-bevel bulge. Consequently, the first notch of the first base and the second notch of the second base are engaged with or disengaged from the first protruding edge and the second protruding edge, respectively.

In accordance with another aspect of the present invention, there is provided an electronic device. The electronic device is detachably mounted on a DIN rail. The DIN rail includes a first protruding edge and a second protruding edge. The electronic device includes a main body and a clip. The main body includes a clipping structure and an auxiliary double-bevel bulge. The clipping structure has a clipping notch. The clip is movably disposed on the main body, and includes a base and an extension part. The base has a notch. The extension part is connected with the base and extended from the base. The extension part includes a double-bevel bulge and an elastic extension arm. The elastic extension arm is located beside the double-bevel bulge and extended outwardly. A free end of the elastic extension arm has an engaging part. The clipping notch of the clipping structure of the main body is engageable with one of the first protruding edge and the second protruding edge. The engaging part of elastic extension arm of the clip is contacted with and movable along the double-bevel bulge, so that the notch of the base of the clip is engaged with or disengaged from the other one of the first protruding edge and the second protruding edge.

In accordance with a further aspect of the present invention, there is provided a clip for assisting in mounting an electronic device on a DIN rail. The DIN rail includes a first protruding edge and a second protruding edge. The clip includes a base and an extension part. The base includes a notch. The notch is selectively engaged with or disengaged from the first protruding edge or the second protruding edge. The extension part is connected with the base and extended from the base, and includes a double-bevel bulge and an elastic extension arm. The elastic extension arm is located beside the double-bevel bulge and extended outwardly. A free end of the elastic extension arm has an engaging part. The double-bevel bulge includes a first bevel and a second bevel.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
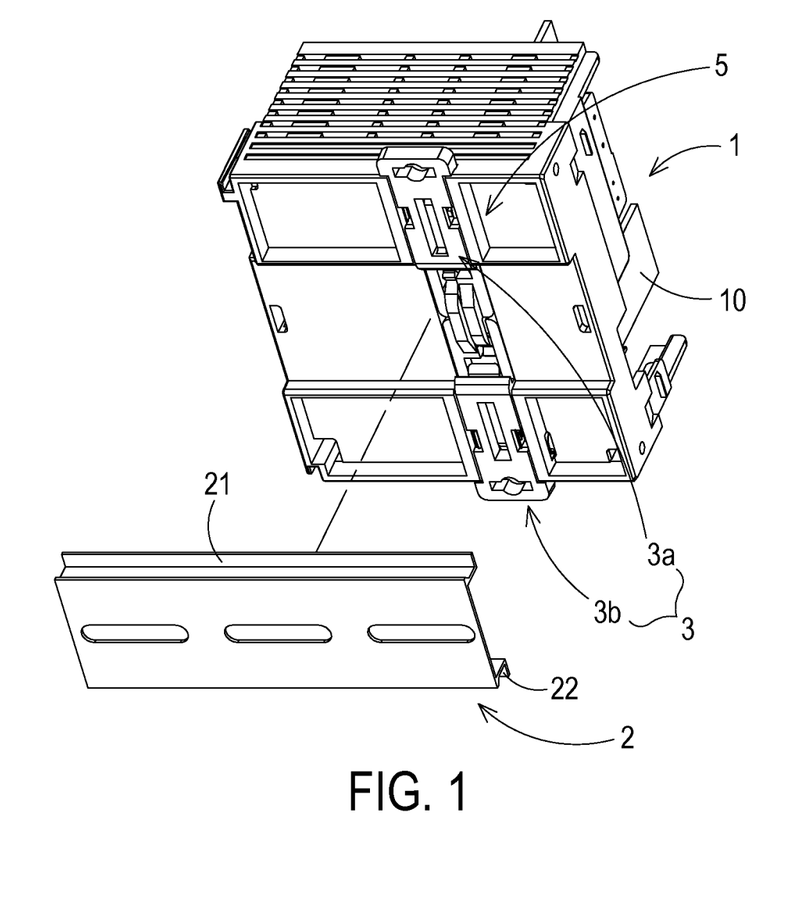
FIG. 1 schematically illustrates the relationship between an electronic device and a DIN rail according to a first embodiment of the present invention.

FIG. 1 schematically illustrates the relationship between an electronic device and a DIN rail according to a first embodiment of the present invention. An example of the electronic device 1 includes but is not limited to a programmable logic controller (PLC). The electronic device 1 comprises a main body 10 and a fastening mechanism 5. The fastening mechanism 5 comprises at least two clips 3. In this embodiment, the at least two clips 3 of the fastening mechanism 5 comprises a first clip 3a and a second clip 3b. The first clip 3a and the second clip 3b have the same structures. The first clip 3a and the second clip 3b are movably disposed on the main body 10 and located at corresponding locations of the main body 10. With the assistance of the first clip 3a and the second clip 3b, the electronic device 1 is engaged with a first protruding edge 21 and a second protruding edge 22 of the DIN rail 2. Consequently, the electronic device 1 is fixed on the DIN rail 2.

Figure 2:
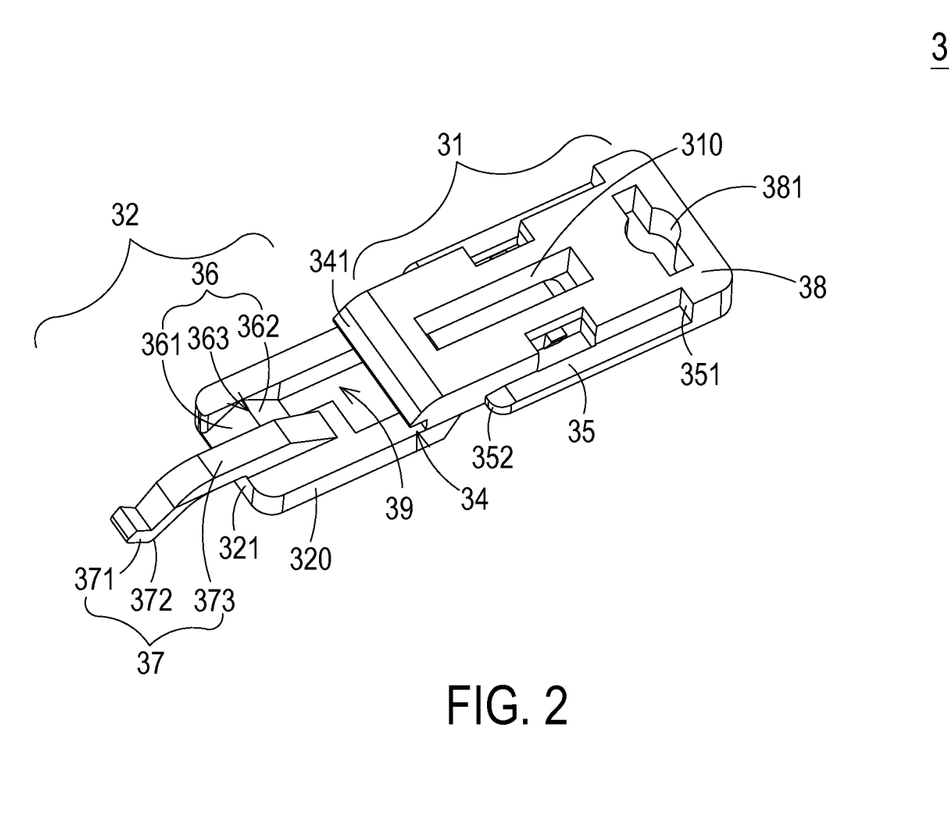
FIG. 2 is a schematic perspective view illustrating a clip of the fastening mechanism of the electronic device according to the first embodiment of the present invention.
Figure 3:
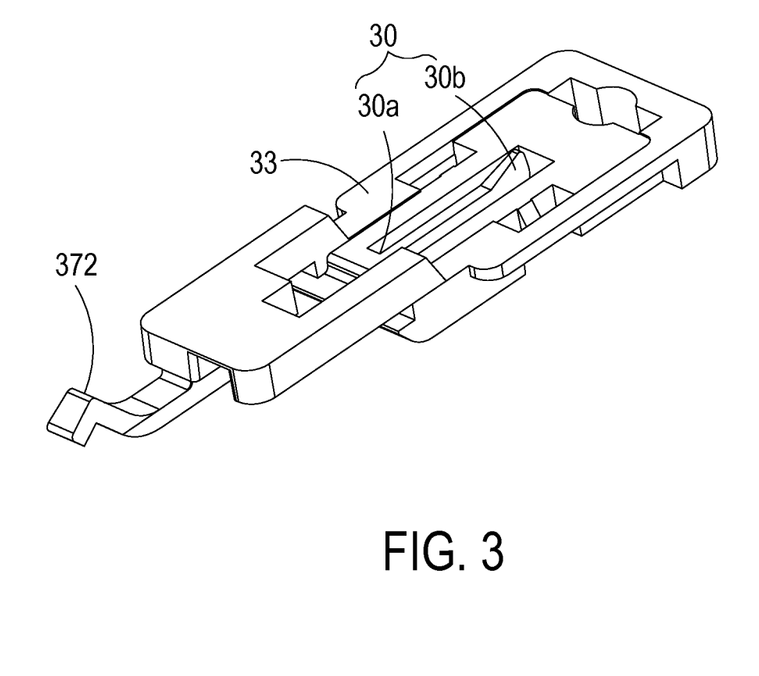
FIG. 3 is a schematic perspective view illustrating the clip of FIG. 2 and taken along another viewpoint.

FIG. 2 is a schematic perspective view illustrating a clip of the fastening mechanism of the electronic device according to the first embodiment of the present invention. FIG. 3 is a schematic perspective view illustrating the clip of FIG. 2 and taken along another viewpoint. Please refer to FIGS. 1, 2 and 3. Each clip 3 comprises a base 31 and an extension part 32. The extension part 32 is extended externally and laterally from a bottom surface 33 of the base 31. The base 31 comprises a notch 34. The notch 34 is located at the junction between the base 31 and the extension part 32. When the electronic device 1 is fixed on the DIN rail 2 through the clip 3, the notch 34 of the clip 3 is engaged with the first protruding edge 21 or the second protruding edge 22 of the DIN rail 2.

In this embodiment, the extension part 32 comprises a platform 320, a double-bevel bulge 36 and an elastic extension arm 37. A first end of the platform 320 is connected with the base 31. The double-bevel bulge 36 and the elastic extension arm 37 are disposed on the platform 320. Moreover, the double-bevel bulge 36 and the elastic extension arm 37 are located adjacent to each other and located at a second end of the platform 320. The elastic extension arm 37 is extended externally from the second end of the platform 320 of the extension part 32. A free end of the elastic extension arm 37 is bent as an engaging part 371. Moreover, the elastic extension arm 37 further comprises a rising segment 373. The rising segment 373 is arranged between the engaging part 371 and the junction of the engaging part 371 and the platform 320.

In this embodiment, the double-bevel bulge 36 is disposed within the platform 320 of the extension part 32. Moreover, the double-bevel bulge 36 is lower than a top surface of the platform 320. The double-bevel bulge 36 comprises a first bevel 361 and a second bevel 362. The first bevel 361 is inclined downwardly from a climax 363 and in a direction toward an outer surface 321 of the extension part 32. The second bevel 362 is inclined downwardly from the climax 363 and in a direction away from the outer surface 321 of the extension part 32. A fixed end of the elastic extension arm 37 is connected with the top surface of the platform 320. Moreover, the engaging part 371 of the elastic extension arm 37 is lower than the top surface of the platform 320. In this embodiment, the engaging part 371 has a contact structure 372. When the two clips 3 are installed on the main body 10 of the electronic device 1, the contact structure 372 of the engaging part 371 of the clip 3 is contacted with and moved along the double-bevel bulge 36 of the corresponding clip 3. Moreover, the platform 320 of the extension part 32 further comprises a receiving part 39. The receiving part 39 is arranged between the double-bevel bulge 36, the elastic extension arm 37 and the notch 34 of the base 31. The receiving part 39 is used for receiving the engaging part 371 of the elastic extension arm 37 of the corresponding clip 3. Moreover, the base 31 has an extension rim 341. The extension rim 341 is located adjacent to notch 34. The extension rim 341 has a slant surface. The slant surface is inclined downwardly from the base 31 and in a direction toward the extension part 32.

Please refer to FIGS. 1, 2 and 3. The base 31 further comprises two coupling ribs 35, a fastening part 38 and a position-limiting part 30. The two coupling ribs 35 are protruded externally from two opposite sides of the base 31. The base 31 further comprises two sustaining surfaces 351. The two sustaining surfaces 351 are located beside the first ends of the two coupling ribs 35, respectively. The second ends of the two coupling ribs 35 are sustaining ends. The fastening part 38 is located at an end of the base 31 that is away from the extension part 32. The fastening part 38 has a fastening hole 381. The fastening hole 381 runs through the base 31. The base 31 further comprises an elongated slot 310. In this embodiment, the position-limiting part 30 is a resilient arm and disposed within the elongated slot 310. A first end 30a of the position-limiting part 30 is connected with an inner surface of the elongated slot 310. A second end 30b of the position-limiting part 30 is a free end and protruded over a bottom surface 33 of the base 31.

Figure 4A:
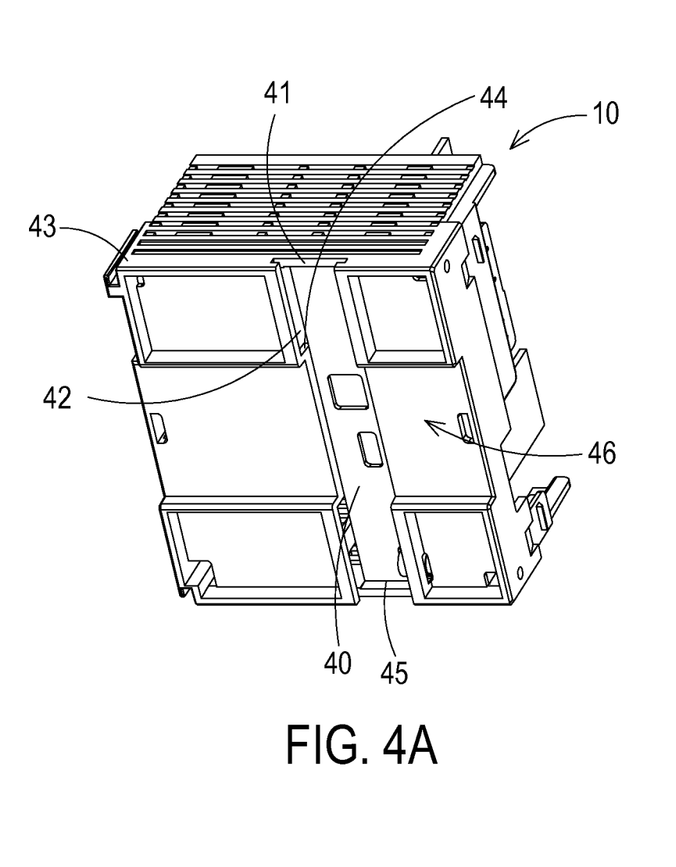
FIG. 4A is a schematic perspective view illustrating the main body of the electronic device of FIG. 1.
Figure 4B:
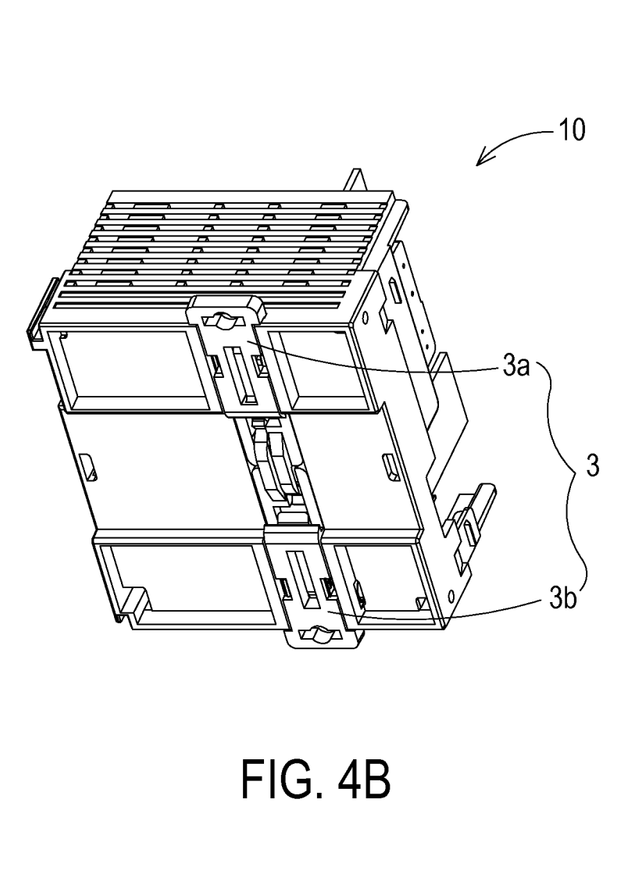
FIG. 4B is a schematic perspective view illustrating the combination of the main body and the two clips of the electronic device of FIG. 1.

FIG. 4A is a schematic perspective view illustrating the main body of the electronic device of FIG. 1. FIG. 4B is a schematic perspective view illustrating the combination of the main body and the two clips of the electronic device of FIG. 1. Please refer to FIGS. 1, 2, 3, 4A and 4B. Corresponding to each clip 3, the bottom surface of the main body 10 comprises a clip accommodation groove 40, an inlet 41, two guiding recesses 42, two sustaining walls 44, a position-limiting plate 45 and a rail accommodation groove 46. The inlet 41 and the position-limiting plate 45 are located adjacent to each other and located at a lateral side 43 of the main body 43. Moreover, the inlet 41 and the position-limiting plate 45 are located at an end of the clip accommodation groove 40. The two guiding recesses 42 and the two sustaining walls 44 are located at two opposite sides of the clip accommodation groove 40, respectively. The two clips 3 are accommodated within the clip accommodation groove 40. The clip 3 is introduced into the clip accommodation groove 40 through the inlet 41. The two coupling ribs 35 of the base 31 of each clip 3 are accommodated within the two guiding recesses 42, respectively. Consequently, the clip 3 can be moved within the clip accommodation groove 40 of the main body 1. The position-limiting plate 45 is used for stopping the position-limiting part 30 of the base 31 of the clip 3 so as to prevent detachment of the clip 3 from the main body 10. The DIN rail 2 can be accommodated within the rail accommodation groove 46. In this embodiment, the rail accommodation groove 46 is perpendicular to the clip accommodation groove 40.

Figure 5A:
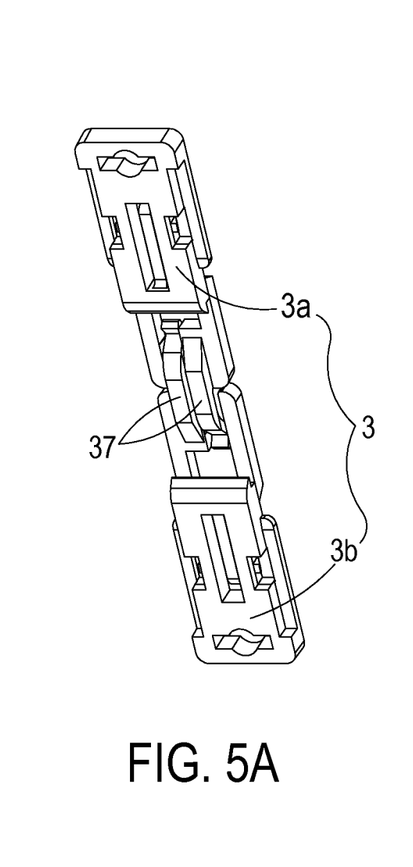
FIGS. 5A, 5B and 5C schematically illustrate the relationships between the two clips of the electronic device in different operating modes.
Figure 5B:
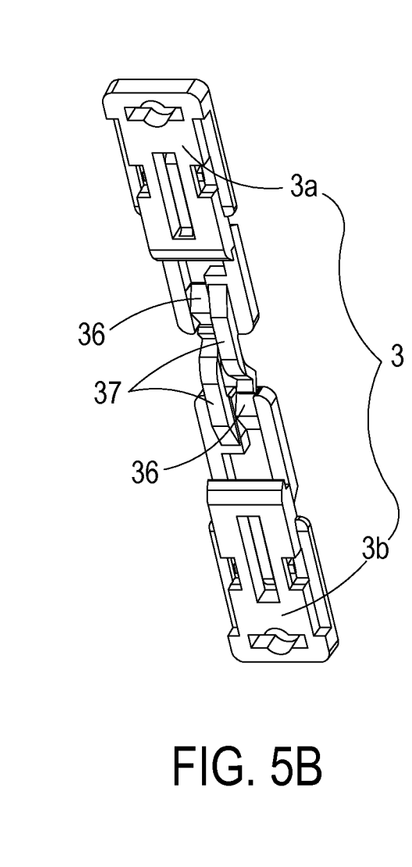
Figure 5C:
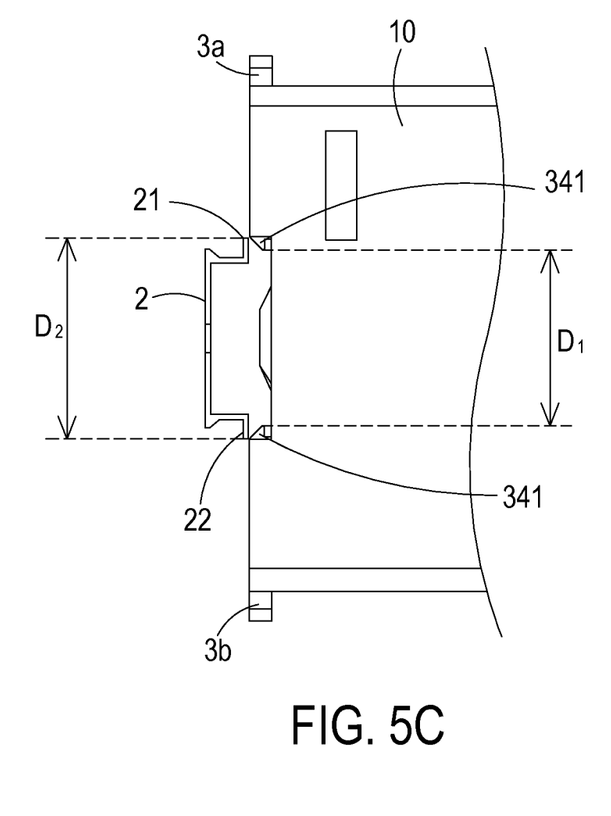

FIGS. 5A, 5B and 5C schematically illustrate the relationships between the two clips of the electronic device in different operating modes. Please refer to FIGS. 1, 2, 3, 4A, 4B and 5A. The two clips 3 are movably disposed within the clip accommodation groove 40 of the main body 10. The bottom surfaces 33 of the two clips 3 face the clip accommodation groove 40 of the main body 10. Moreover, the coupling ribs 35 of the two clips 3 are accommodated within the corresponding guiding recesses 42. For clarification and brevity, the main body 10 of the electronic device 1 is not shown. As shown in FIG. 5A, the two clips 3 are in the first operating mode (i.e., a non-use state). In the first operating mode, the two clips 3 are accommodated within the clip accommodation groove 40 of the main body 10, the extension parts 32 of the two clips 3 are contacted with each other, and the engaging parts 371 of the elastic extension arms 37 are contacted with the second bevels 362 of the double-bevel bulges 36 of the corresponding clips 3. In particular, the contact structure 372 of the engaging part 371 of the elastic extension arm 37 of the first clip 3a is contacted with the second bevel 362 of the double-bevel bulge 36 of the second clip 3b and received within the receiving part 39 of the second clip 3b; and the contact structure 372 of the engaging part 371 of the elastic extension arm 37 of the second clip 3b is contacted with the second bevels 362 of the double-bevel bulge 36 of the first clip 3a and received within the receiving part 39 of the first clip 3a. Under this circumstance, the sustaining surfaces 351 of the bases 351 of the two clips 3 are contacted with the outer peripheries of the corresponding inlets 41 of the main body 10.

Please refer to FIGS. 1, 2, 3, 4A, 4B and 5C. In the second operating module, the electronic device 1 is being mounted on the DIN rail 2 through the two clips 3. Meanwhile, the two clips 3 are in a usage state. While the electronic device 1 is moved downwardly to push the first protruding edge 21 and the second protruding edge 22 of the DIN rail 2, the first protruding edge 21 and the second protruding edge 22 of the DIN rail 2 are contacted with the extension rims 341 of the bases 31 of the two clips 3. In response to the horizontal components of the pushing force, the two clips 3 are slightly moved away from each other. Consequently, the extension parts 32 of the two clips 3 are separated from each other and moved along different directions. That is, the contact structure 372 of the engaging part 371 of the elastic extension arm 37 of the first clip 3a is moved toward the climax 363 along the second bevel 362 of the double-bevel bulge 36 of the second clip 3b; and the contact structure 372 of the engaging part 371 of the elastic extension arm 37 of the second clip 3b is moved toward the climax 363 along the second bevel 362 of the double-bevel bulge 36 of the first clip 3a. At the same time, the rising segments 373 of the elastic extension arms 37 are subjected to deformation. The first protruding edge 21 and the second protruding edge 22 of the DIN rail 2 are continuously pressed until the distance D1 between the extension rims 341 of the two clips 3 is equal to the width of the DIN rail 2 (i.e., the distance D2 between the first protruding edge 21 and the second protruding edge 22). After the first protruding edge 21 and the second protruding edge 22 of the DIN rail 2 are transferred through the extension rims 341 of the two clips 3, the first protruding edge 21 and the second protruding edge 22 are introduced into the notches 34 of the two clips 3. Since the pushing force is released and the rising segments 373 of the elastic extension arms 37 are restored, the two clips 3 are moved toward each other and the two clips 3 are correspondingly returned to their original positions. Under this circumstance, the first protruding edge 21 and the second protruding edge 22 of the DIN rail 2 are locked into the corresponding notches 34 of the bases 31 of the two clips 3, and the DIN rail 2 is partially accommodated within the rail accommodation groove 46 of the main body 10. Moreover, due to the clamping action of the two clips 3, the electronic device 1 can be securely fixed on the DIN rail 2.

Please refer to FIGS. 1, 2, 3, 4A, 4B and 5B. In the third operating module, the electronic device 1 is being detached from the DIN rail 2 through the two clips 3. Meanwhile, the two clips 3 are in a detachment state. By externally pulling one of the two clips 3, the contact structure 372 of the engaging part 371 of the elastic extension arm 37 of the first clip 3a is moved across the climax 363 along the second bevel 362 of the double-bevel bulge 36 of the second clip 3b and then moved along the first bevel 361 of the double-bevel bulge 36 of the second clip 3b, and the contact structure 372 of the engaging part 371 of the elastic extension arm 37 of the second clip 3b is moved across the climax 363 along the second bevel 362 of the double-bevel bulge 36 of the first clip 3a and then moved along the first bevel 361 of the double-bevel bulge 36 of the first clip 3a. During the process of moving the elastic extension arms 37, the rising segments 373 of the elastic extension arms 37 are subjected to deformation. Consequently, the two clips 3 are moved away from each other, and the two clips 3 can be easily separated from each other by the user. Under this circumstance, the first protruding edge 21 and the second protruding edge 22 of the DIN rail 2 are detached from the extension rims 341 of the bases 31 of the two clips 3. Since the DIN rail 2 is no longer clamped by the two clips 3, the electronic device 1 is detached from the DIN rail 2.

In the above embodiment, the electronic device 1 is mounted on the DIN rail 2 through the two clips 3. Moreover, according to the practical requirements, the electronic device 1 may be mounted on a computer case or a wall surface through the two clips 3. For mounting the electronic device 1 on the computer case or the wall surface, the user may penetrate a fastening element (e.g., a screw) through the fastening hole 381 of the fastening part 38 in order to fix the electronic device 1 on the computer case or the wall surface. When the electronic device 1 is fixed on the computer case or the wall surface, the coupling ribs 35 of the clips 3 are engaged with the corresponding guiding recesses 42 of the main body 10 and the position-limiting parts 30 of the clips 3 are stopped by the position-limiting plates 45 of the main body 10. Under this circumstance, since the clips 3 are not detached from the main body 10 of the electronic device 1, the electronic device 1 can be fixed on the computer case or the wall surface.

Figure 6:
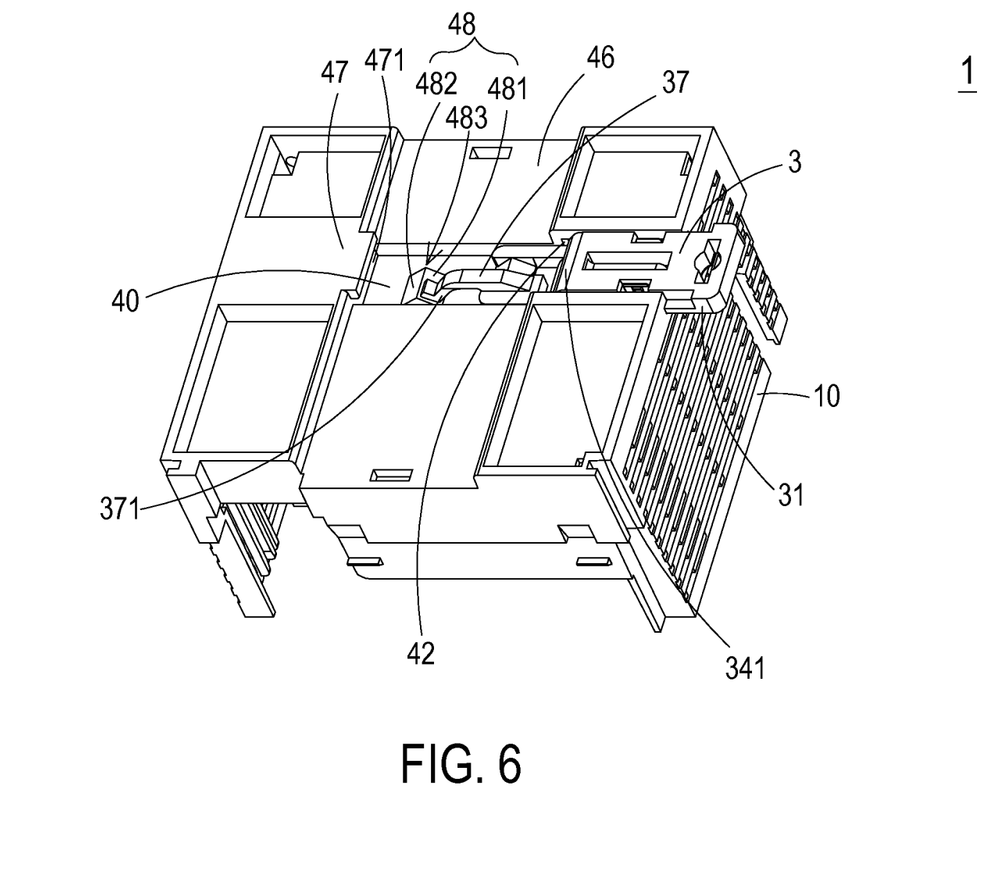
FIG. 6 is a schematic perspective view illustrating an electronic device according to a second embodiment of the present invention.

FIG. 6 is a schematic perspective view illustrating an electronic device according to a second embodiment of the present invention. Please refer to FIG. 6 and also refer to FIGS. 1, 2, 3. The structures, functions and operating principles of the electronic device 1 and the clip 3 are similar to those of FIG. 1, and are not redundantly described herein. Component parts and elements corresponding to those of the first embodiment are designated by identical numeral references, and detailed descriptions thereof are omitted. In comparison with the first embodiment, the electronic device 1 comprises a single clip 3, and the main body 10 further comprises a clipping structure 47 and an auxiliary double-bevel bulge 48. The clipping structure 47 is disposed on a bottom surface of the main body 10, located beside the rail accommodation groove 46, and aligned with the clip accommodation groove 40. The clipping structure 47 has a clipping notch 471. The clipping notch 471 is aligned with the clip accommodation groove 40. The auxiliary double-bevel bulge 48 is disposed within the clip accommodation groove 40 and located at the position corresponding to the elastic extension arm 37 of the extension part 32 of the clip 3. The auxiliary double-bevel bulge 48 has a third bevel 481 and a fourth bevel 482. The third bevel 481 is inclined downwardly from a climax 483 of the auxiliary double-bevel bulge 48 and in a direction away from the clipping structure 47. The fourth bevel 482 is inclined downwardly from the climax 483 and in a direction toward the clipping structure 47. In other words, the third bevel 481 and the fourth bevel 482 are opposed to each other with respect to the climax 483.

Please refer to FIG. 6 and also refer to FIGS. 1, 2, 3. The clip 3 is movably disposed within the clip accommodation groove 40 of the main body 10. The bottom surface 30 of the clip 3 faces the clip accommodation groove 40 of the main body 10. The coupling ribs 35 of the clip 3 are accommodated within the corresponding guiding recesses 42. When the clip 3 is accommodated within the clip accommodation groove 40 of the main body 10 and operated in the first operating mode (i.e., the non-use state), the engaging part 371 of the elastic extension arm 37 of the clip 3 is contacted with the fourth bevel 482 of the auxiliary double-bevel bulge 48.

In the second operating module, the electronic device 1 is being mounted on the DIN rail 2 through the clip 3. Meanwhile, the clip 3 is in a usage state. Firstly, the clipping notch 471 of the clipping structure 47 is engaged with the second protruding edge 22 of the DIN rail 2. Then, the electronic device 1 is moved downwardly to push the first protruding edge 21 of the DIN rail 2, and thus the first protruding edge 21 is contacted with the extension rim 341 of the base 31 of the clip 3. In response to the horizontal component of the pushing force, the clip 3 is slightly moved away from the clipping structure 47. Meanwhile, the engaging part 371 of the elastic extension arm 37 of the clip 3 is moved toward the climax 483 along the fourth bevel 482 of the auxiliary double-bevel bulge 48. At the same time, the rising segment 373 of the elastic extension arm 37 is subjected to deformation. As the first protruding edge 21 of the DIN rail 2 is continuously pressed, the engaging part 371 of the elastic extension arm 37 of the clip 3 is moved along the fourth bevel 482 of the auxiliary double-bevel bulge 48 but not moved across the climax 483. After the first protruding edge 21 of the DIN rail 2 are transferred through the extension rim 341 of the clip 3, the first protruding edge 21 is introduced into the notch 34 of the clip 3. Since the pushing force is released and the rising segment 373 of the elastic extension arm 37 is restored, the clip 3 is moved toward the clipping structure 47 and the clip 3 is correspondingly returned to its original position. Under this circumstance, the first protruding edge 21 and the second protruding edge 22 of the DIN rail 2 are locked into the notch 34 of the clip 3 and the clipping notch 471 of the clipping structure 47, and the DIN rail 2 is partially accommodated within the rail accommodation groove 46 of the main body 10. Moreover, due to the clamping action of the clip 3 and the clipping structure 47, the electronic device 1 can be securely fixed on the DIN rail 2.

In the third operating module, the electronic device 1 is being detached from the DIN rail 2. Meanwhile, the clip 3 is in a detachment state. By externally pulling clip 3, the contact structure 372 of the engaging part 371 of the elastic extension arm 37 of the clip 3 is moved across the climax 483 along the fourth bevel 482 of the auxiliary double-bevel bulge 48 and then moved along the third bevel 481 of the auxiliary double-bevel bulge 48. During the process of moving the elastic extension arm 37 to the third bevel 383 across the climax 483, the rising segment 373 of the elastic extension arm 37 is subjected to deformation. Consequently, the clip 3 is moved away from the clipping structure 47. Under this circumstance, the first protruding edge 21 and the second protruding edge 22 of the DIN rail 2 are detached from the notch 34 of the clip 3 and the clipping notch 471 of the clipping structure 47. Since the DIN rail 2 is no longer clamped by the clipping structure 47 and the clip 3, the electronic device 1 is detached from the DIN rail 2.

Figure 7:
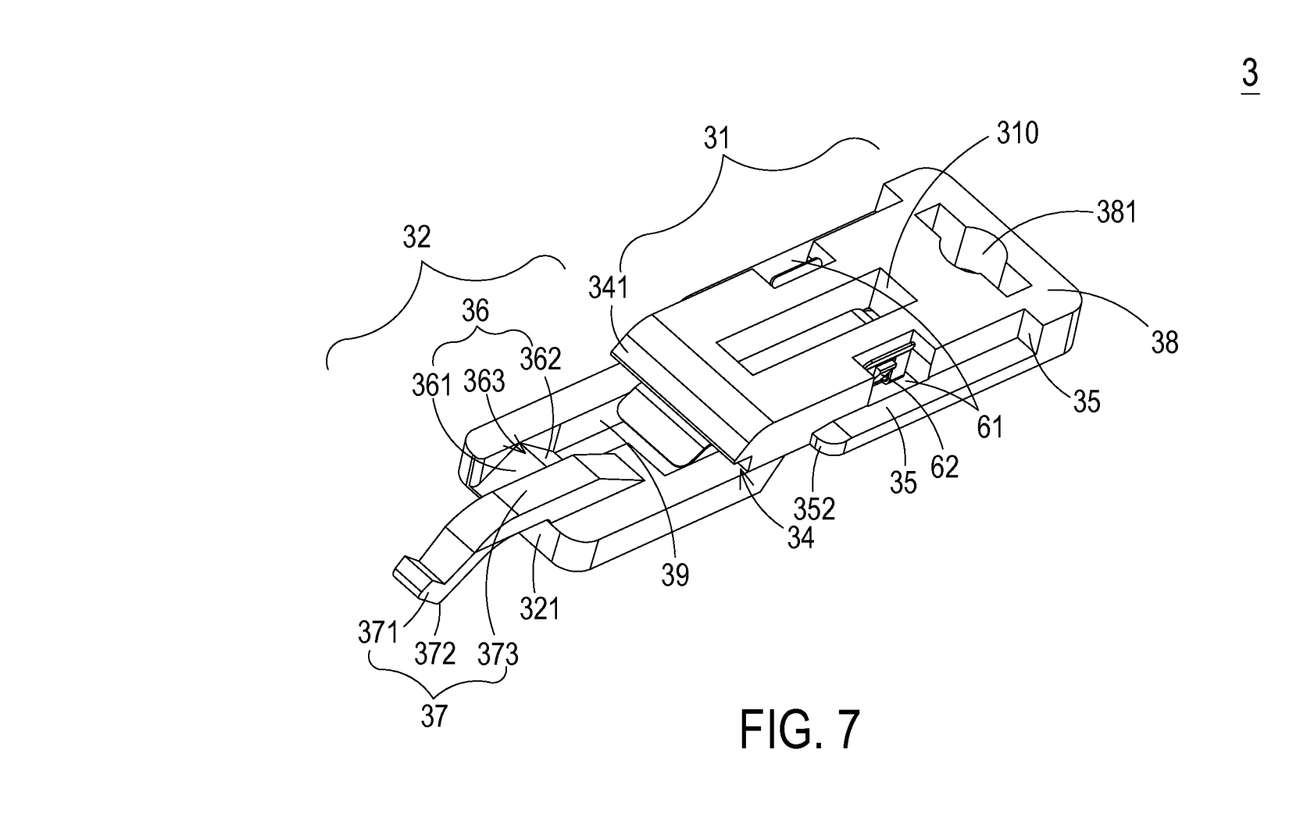
FIG. 7 is a schematic perspective view illustrating a clip according to another embodiment of the present invention.
Figure 8:
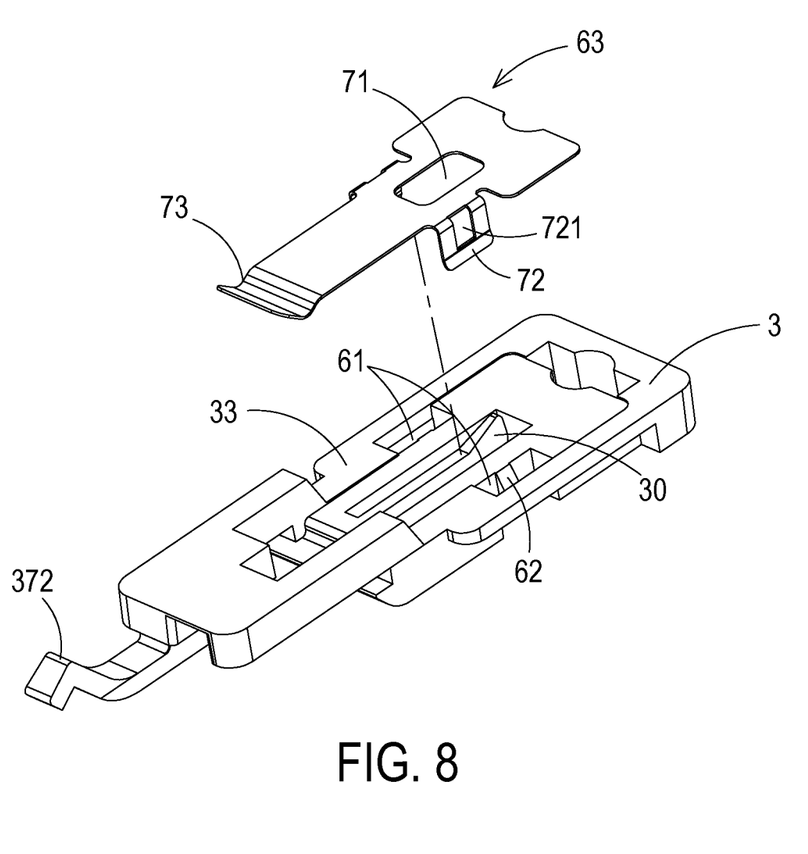
FIG. 8 is a schematic exploded view of the clip of FIG. 7.

FIG. 7 is a schematic perspective view illustrating a clip according to another embodiment of the present invention. FIG. 8 is a schematic exploded view of the clip of FIG. 7. The structures, functions and operating principles of the clip 3 are similar to those of FIGS. 1 and 2, and are not redundantly described herein. Component parts and elements corresponding to those of the first embodiment are designated by identical numeral references, and detailed descriptions thereof are omitted. In comparison with FIGS. 2 and 3, the clip 3 further comprises two locking recesses 61 and a grounding element 63. The two locking recesses 61 are opposed to each other, formed in the base 31 and arranged between the coupling ribs 35 and the elongated slot 310. The locking recesses 61 are located beside the coupling ribs 35. Moreover, a protrusion 62 is formed on the inner surface of the locking recess 61. The grounding element 63 is disposed on a bottom surface 33 of the base 31. The grounding element 63 comprises an opening 71, two locking arms 72 and a contact terminal 73. The opening 71 is aligned with the elongated slot 310 of the clip 3, and the position-limiting part 30 is penetrated through the opening 71 of the grounding element 63. The two locking arms 72 are located at two opposite sides of the opening 71. Moreover, each locking arm 72 has a locking hole 721 corresponding to the protrusion 62. Due to the engagement between the locking holes 721 of the locking arms 72 and the protrusions 62, the grounding element 63 is fixed on the clip 3. Under this circumstance, the contact terminal 73 is externally protruded out of the base 31 and partially accommodated within the receiving part 39.

After the clip 3 including the grounding element 63, the main body 10 and the DIN rail 2 are combined together, a circuit board (not shown) within the main body 10 is electrically connected with the grounding element 63. In particular, a portion of the contact terminal 73 is accommodated within the receiving part 39 and contacted with the first protruding edge 21 or the second protruding edge 22 of the DIN rail 2. Consequently, through the grounding element 63, the circuit board of the main body 10 is contacted and electrically connected with the DIN rail 2 and conducted to the ground.

From the above descriptions, the present invention provides a clip and an electronic device with the clip. The clip has simplified structure and low cost. Consequently, the electronic device can be easily mounted on or detached from the DIN rail through the clip.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic device detachably mounted on a DIN rail, the DIN rail comprising a first protruding edge and a second protruding edge, the electronic device comprising:
    a main body; and
    two clips movably disposed on the main body and located at corresponding locations of the main body, wherein each of the two clips comprises:
        a base having a notch; and
        an extension part connected with and extended from the base, and comprising a double-bevel bulge and an elastic extension arm, wherein the elastic extension arm is located beside the double-bevel bulge and extended outwardly, and a free end of the elastic extension arm has an engaging part;
    wherein the engaging part of the elastic extension arm of one of the two clips is contacted with and movable along the double-bevel bulge of the other one of the two clips, so that the notches of the bases of the two clips are engaged with or disengaged from the first protruding edge and the second protruding edge of the DIN rail, respectively.

2. The electronic device according to claim 1, wherein each of the double-bevel bulges comprises a first bevel and a second bevel, wherein the first bevel is inclined downwardly from a climax and in a direction toward an outer surface of the extension part, and the second bevel is inclined downwardly from the climax and in a direction away from the outer surface of the extension part.

3. The electronic device according to claim 2, wherein when the engaging part of the elastic extension arm of one of the two clips is contacted with the second bevel of the double-bevel bulge of the other one of the two clips, and the first protruding edge and the second protruding edge of the DIN rail are respectively locked into the notches of the bases of the two clips, the electronic device is fixed on the DIN rail through the two clips.

4. The electronic device according to claim 2, wherein when the engaging part of the elastic extension arm of one of the two clips is contacted with the first bevel of the double-bevel bulge of the other one of the two clips, and the first protruding edge and the second protruding edge of the DIN rail are respectively disengaged from the notches of the bases of the two clips, the electronic device is detached from the DIN rail.

5. The electronic device according to claim 1, wherein each of the extension parts further comprises a platform, the double-bevel bulge is disposed within the platform of the extension part, the double-bevel bulge is lower than a top surface of the platform, a first end of the elastic extension arm is connected with the top surface of the platform, a second end of the elastic extension arm is bent as the engaging part, and the first engaging part is lower than the top surface of the platform.

6. The electronic device according to claim 5, wherein each of the elastic extension arms further comprises a rising segment, and the rising segment is arranged between the engaging part and a junction of the engaging part and the platform.

7. The electronic device according to claim 1, wherein each of the extension parts further comprises a receiving part, and the receiving part is arranged between the double-bevel bulge, the elastic extension arm and the notch of the base.

8. The electronic device according to claim 1, wherein each of the bases has an extension rim beside the notch, and the extension rim has a slant surface inclined downwardly from the base and in a direction toward the extension part.

9. The electronic device according to claim 1, wherein each of the bases comprises:
    two coupling ribs disposed on two opposite sides of the base, respectively;
    a fastening part located at an end of the base, and comprising a fastening hole; and
    a position-limiting part disposed within an elongated slot of the base, wherein a first end of the position-limiting part is connected with an inner surface of the elongated slot, and a second end of the position-limiting part is protruded over a bottom surface of the base.

10. The electronic device according to claim 9, wherein the main body comprises:
    a clip accommodation groove formed in a bottom surface of the main body;
    an inlet located at a lateral side of the main body and located at an end of the clip accommodation groove;
    two guiding recesses located at two opposite sides of the clip accommodation groove and beside the inlet for accommodating the two coupling ribs of the base;

two sustaining walls located beside the two guiding recesses, respectively;

a position-limiting plate located at the lateral side of the main body and located at the end of the clip accommodation groove for stopping the position-limiting part of the base; and a rail accommodation groove interconnected with and perpendicular to the clip accommodation groove for accommodating the DIN rail.

11. The electronic device according to claim 1, wherein at least one of the clips further comprises a grounding element, wherein the grounding element is disposed on the base.

12. The electronic device according to claim 1, wherein the electronic device is a programmable logic controller.

13. An electronic device detachably mounted on a DIN rail, the DIN rail comprising a first protruding edge and a second protruding edge, the electronic device comprising:

a main body comprising a clipping structure and an auxiliary double-bevel bulge, wherein the clipping structure has a clipping notch; and a clip movably disposed on the main body, and comprising a base and an extension part, wherein the base has a notch, the extension part is connected with the base and extended from the base, and the extension part comprises a double-bevel bulge and an elastic extension arm, wherein the elastic extension arm is located beside the double-bevel bulge and extended outwardly, and a free end of the elastic extension arm has an engaging part, wherein the clipping notch of the clipping structure of the main body is engageable with one of the first protruding edge and the second protruding edge, and the engaging part of the elastic extension arm of the clip is contacted with and movable along the double-bevel bulge, so that the notch of the base of the clip is engaged with or disengaged from the other one of the first protruding edge and the second protruding edge.

14. The electronic device according to claim 13, wherein the double-bevel bulge comprises a first bevel and a second bevel, and the auxiliary double-bevel bulge comprises a third bevel and a fourth bevel, wherein the third bevel is inclined downwardly from a climax of the auxiliary double-bevel bulge and in a direction away from the clipping structure, the fourth bevel is inclined downwardly from the climax and in a direction toward the clipping structure, and the third bevel and the fourth bevel are opposed to each other with respect to the climax.

15. The electronic device according to claim 14, wherein when the engaging part of the elastic extension arm of the clip is contacted with the fourth bevel of the auxiliary double-bevel bulge and the first protruding edge and the second protruding edge of the DIN rail are respectively locked into the notch of the clip and the clipping notch of the clipping structure, the electronic device is fixed on the DIN rail.

16. The electronic device according to claim 14, wherein when the engaging part of the elastic extension arm of the clip is contacted with the third bevel of the auxiliary double-bevel bulge and the first protruding edge and the second protruding edge of the DIN rail are respectively disengaged from the notch of the clip and the clipping notch of the clipping structure, the electronic device is detached from the DIN rail.

17. A clip for assisting in mounting an electronic device on a DIN rail, the DIN rail comprising a first protruding edge and a second protruding edge, the clip comprising:

a base comprising a notch, wherein the notch is selectively engaged with or disengaged from the first protruding edge or the second protruding edge; and an extension part connected with the base and extended from the base, and comprising a double-bevel bulge and an elastic extension arm, wherein the elastic extension arm is located beside the double-bevel bulge and extended outwardly, a free end of the elastic extension arm has an engaging part, and the double-bevel bulge comprises a first bevel and a second bevel.

* * * * *